(12) United States Patent
Suzuki et al.

(10) Patent No.: US 9,069,043 B2
(45) Date of Patent: Jun. 30, 2015

(54) TERMINATION CIRCUIT, SEMICONDUCTOR DEVICE, AND TEST SYSTEM

(71) Applicant: FUJITSU LIMITED, Kawasaki-shi, Kanagawa (JP)

(72) Inventors: Toshihide Suzuki, Zama (JP); Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 71 days.

(21) Appl. No.: 13/961,112

(22) Filed: Aug. 7, 2013

(65) Prior Publication Data
US 2013/0326300 A1    Dec. 5, 2013

Related U.S. Application Data

(63) Continuation of application No. PCT/JP2011/001540, filed on Mar. 16, 2011.

(51) Int. Cl.
| | |
|---|---|
| *H03K 17/16* | (2006.01) |
| *H03K 19/003* | (2006.01) |
| *G01R 31/3183* | (2006.01) |
| *H04L 25/02* | (2006.01) |
| *H03H 11/30* | (2006.01) |
| *H03F 1/56* | (2006.01) |

(Continued)

(52) U.S. Cl.
CPC ........ *G01R 31/3183* (2013.01); *H04L 25/0278* (2013.01); *G01R 31/2822* (2013.01); *H03K 17/161* (2013.01); *H03H 11/30* (2013.01); *H03F 1/56* (2013.01); *H04B 1/0458* (2013.01); *H04L 25/0298* (2013.01); *H03F 2200/387* (2013.01)

(58) Field of Classification Search
CPC .................................. H03K 17/16; H04B 1/44
USPC ............ 326/30, 16, 26, 23, 27; 327/308, 310
See application file for complete search history.

(56) References Cited

U.S. PATENT DOCUMENTS

| | | | |
|---|---|---|---|
| 6,556,039 B2 | 4/2003 | Nagano | |
| 8,756,647 B2 * | 6/2014 | de Leeuw | 725/151 |

(Continued)

FOREIGN PATENT DOCUMENTS

| | | |
|---|---|---|
| JP | H1-206277 | 8/1989 |
| JP | 05-083113 A | 4/1993 |
| JP | H6-125261 | 5/1994 |

(Continued)

OTHER PUBLICATIONS

Japanese Office Action mailed Apr. 15, 2014 in counterpart application No. 2013-504401 with English translation.

(Continued)

*Primary Examiner* — Daniel D Chang
(74) *Attorney, Agent, or Firm* — Kratz, Quintos & Hanson, LLP

(57) ABSTRACT

A termination circuit includes a pMOS transistor configured to have a source connected with a signal terminal outputting or inputting a transmission signal, a drain connected with a grounding line, and a gate receiving a control signal, the pMOS transistor being turned on when enabling a characteristic impedance matching function and being turned off when disabling the matching function; and an inductor and a capacitor configured to be connected with the signal terminal for matching characteristic impedance.

8 Claims, 13 Drawing Sheets

(51) Int. Cl.
*G01R 31/28* (2006.01)
*H04B 1/04* (2006.01)

(56) References Cited

U.S. PATENT DOCUMENTS

| | | |
|---|---|---|
| 2002/0175700 A1 | 11/2002 | Nagano |
| 2010/0029226 A1 | 2/2010 | Visser |

FOREIGN PATENT DOCUMENTS

| | | |
|---|---|---|
| JP | H8-293778 | 11/1996 |
| JP | 09-083411 A | 3/1997 |
| JP | H11-41121 | 2/1999 |
| JP | 2002-344300 A1 | 11/2002 |
| JP | 2006-135344 A1 | 5/2006 |
| JP | 2008-35165 A1 | 2/2008 |

OTHER PUBLICATIONS

International Search Report for International Application No. PCT/JP2011/001540 dated May 10, 2011.

Salter, T., et al., "Parasitic Aware Optimization of an RF Power Scavenging Circuit with Applications to Smartdust Sensor Networks," Laboratory for Physical Sciences, College Park, MD 20740, USA, Department of Electrical Engineering, University of Maryland, College Park, MD, 20742, USA, IEEE (2009), pp. 332-335.

Extended European Search Report dated Oct. 27, 2014, in the corresponding European patent application No. 11860939.5-1860.

* cited by examiner

US 9,069,043 B2

TERMINATION CIRCUIT, SEMICONDUCTOR DEVICE, AND TEST SYSTEM

CROSS-REFERENCE TO RELATED APPLICATIONS

This application is a continuation application of International Application PCT/JP2011/001540 filed on Mar. 16, 2011 and designated the U.S., the entire contents of which are incorporated herein by reference.

FIELD

The disclosures herein relate to a termination circuit, a semiconductor device equipped with a termination circuit, and a test system.

BACKGROUND

In general, a circuit block that outputs or inputs a high-frequency transmission signal is formed with a termination circuit for matching characteristic impedance. For example, in a receiver circuit for receiving an input signal, a pull-up resistor connected with an input terminal is formed with, for example, a p-channel MOS transistor having its source connected with a power source line (see, for example, Patent Document 1).

RELATED-ART DOCUMENTS

Patent Documents

[Patent Document 1] Japanese Laid-open Patent Publication No. 06-125261

SUMMARY

According to an embodiment of the present invention, a termination circuit includes a pMOS transistor configured to have a source connected with a signal terminal outputting or inputting a transmission signal, a drain connected with a grounding line, and a gate receiving a control signal, the pMOS transistor being turned on when enabling a characteristic impedance matching function and being turn off when disabling the matching function; and an inductor and a capacitor configured to be connected with the signal terminal for matching characteristic impedance.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

Figure 1:
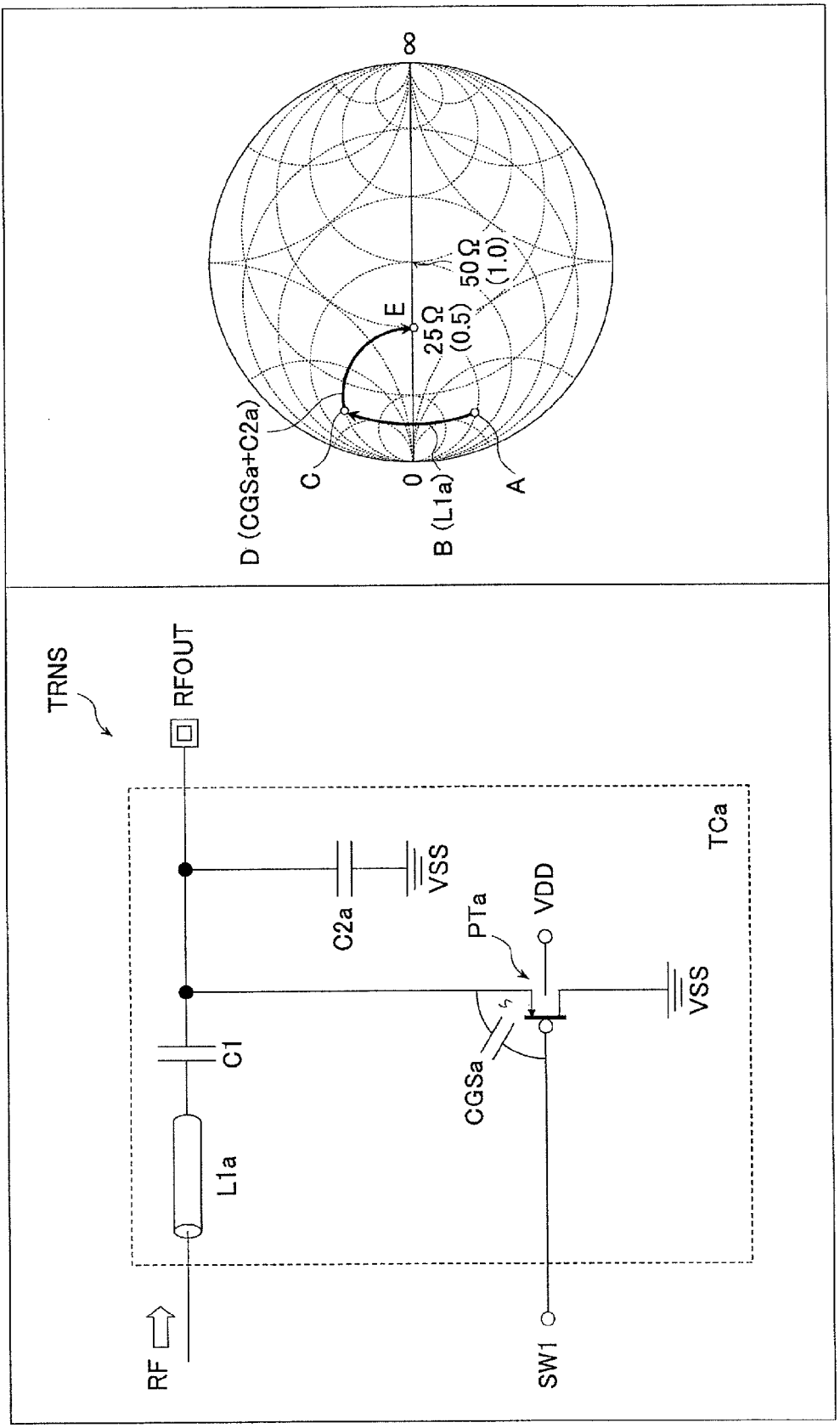
FIG. 1 is a schematic view illustrating an example of a termination circuit according to an embodiment.

In the following, the embodiments will be described with reference to the drawings. Double square marks in the drawings designate external terminals. An external terminal is, for example, a pad on a semiconductor chip, a lead of a package including a semiconductor chip, or an external terminal of a macro block. A signal supplied via an external terminal is given the same symbol as the name of the terminal.

FIG. 1 is a schematic view illustrating an example of a termination circuit TCa according to an embodiment. A circle on the right side in FIG. 1 designates a Smith chart, which illustrates trajectories of characteristic impedance changed when elements are added. The termination circuit TCa is formed, for example, in a transmission circuit TRNS outputting a high-frequency transmission signal RF from an output terminal RFOUT. The transmission circuit TRNS may be built in a communication device such as a cellular phone, an on-board radar, and the like. The transmission signal RF is generated, for example, by amplifying a reference signal from a signal generator with an amplifier.

The termination circuit TCa includes an inductor L1a and capacitors C1 and C2a for matching characteristic impedance, and a pMOS (p-channel Metal Oxide Semiconductor) transistor PTa for switching an impedance matching function between enabled and disabled states. The inductor L1a is formed, for example, using a signal transmission line. The capacitors C1 and C2a are formed, for example, using conductive films (kinds of signal transmission lines) facing each other via an insulation film. The inductor L1a and capacitor C1 are disposed between a generator of the transmission signal RF and the output terminal RFOUT in this order. The capacitor C1 is added for cutting off a DC component between the generator of the transmission signal RF and the output terminal RFOUT, and for making the DC bias of the output terminal RFOUT to be 0 V. The capacitor C2a is disposed between the output terminal RFOUT and a grounding line VSS.

The pMOS transistor PTa has its source connected with the output terminal RFOUT, its drain connected with the grounding line VSS, and its back gate connected with the power source line VDD, and receives a control signal SW1 at its gate. The power supply voltage VDD may be set to, for example, 1 V, although not limited to it. Symbol CGSa designates a parasitic capacitance generated between the gate and source of the pMOS transistor PTa.

The control signal SW1 is set to an activation level (for example, −VDD=−1V) for turning on the pMOS transistor PTa to enable the characteristic impedance matching function of the termination circuit TCa. The control signal SW1 is set to a non-activation level (for example, VDD=1V) for turning off the pMOS transistor PTa to disable the characteristic impedance matching function of the termination circuit TCa. For example, the termination circuit TCa is enabled when monitoring the signal level of the transmission signal RF at the output terminal RFOUT without being connected with a probe or a test device for high frequency, and is disabled when the transmission circuit TRNS built in a system operates as a part of the system.

On-resistance between the source and drain of the pMOS transistor PTa is designed to take 50Ω when the control signal SW1 is set to the activation level. For example, the on-resistance of the pMOS transistor PTa changes depending on a ratio of gate width and channel length. The value of the parasitic capacitance CGSa is determined depending on a gate area and a material, thickness, and the like of the gate insulation film for making the on-resistance be 50Ω. Also, the values of the inductor L1a and capacitor C2a are set so that the characteristic impedance of the transmission signal RF, which has a predetermined frequency (for example, 77 GHz), takes 50Ω when the termination circuit TCa is enabled.

A Smith chart illustrated in FIG. 1 illustrates the characteristic impedance of the pMOS transistor PTa, when it is in an on-state at the predetermined frequency (for example, 77 GHz). In the Smith chart, when the termination circuit TCa and an external termination resistor is not connected with the output terminal RFOUT (RFOUT=open state), the characteristic impedance of the transmission signal RF having the predetermined frequency is positioned at Point A. The inductor L1a and capacitor C1 are provided in series with the transfer path of the transmission signal RF. The parasitic capacitance CGSa and capacitor C2a are provided in parallel with the transfer path of the transmission signal RF.

This makes the characteristic impedance be positioned at Point E after travelling along Trajectory B, Point C, and Trajectory D when the pMOS transistor PTa is on. Here, the capacitor C1 works on the characteristic impedance to push it back through Trajectory B in the reverse direction. Therefore, if the capacitance value of the capacitor C1 is small and the influence on the trajectory of the characteristic impedance is not negligible, the inductor L1a is designed to have a slightly greater inductance considering the push-back amount of the characteristic impedance caused by the capacitor C1.

Point E is positioned on the axis of the resistance value, designating 25Ω (0.5 in terms of a normalized resistance value). The characteristic impedance (output impedance) of the transmission circuit TRNS with respect to the output terminal RFOUT is designed to take 50Ω. Therefore, in a state where the pMOS transistor PTa is on and the termination circuit TCa is added to the output terminal RFOUT, the characteristic impedance becomes 25Ω. Thus, the state where pMOS transistor PTa is on is equivalent to a state where a termination resistor of 50Ω is connected with the output terminal RFOUT. In other words, a state equivalent to the state where a termination resistor is connect with the output terminal RFOUT can be implemented with the termination circuit TCa, without actually connecting such a termination resistor with the output terminal RFOUT.

As illustrated in the Smith chart, a deviation of the characteristic impedance caused by the parasitic capacitance CG2a can be canceled by the inductor L1a and capacitor C2a. Therefore, when the pMOS transistor PTa is off, it is possible to prevent the transmission signal RF from leaking to the gate via the parasitic capacitance CGSa. As a result, on/off ratio can be made greater, which is a ratio of the current value when pMOS transistor PTa is on and the current value (leakage current) when off.

Figure 2:
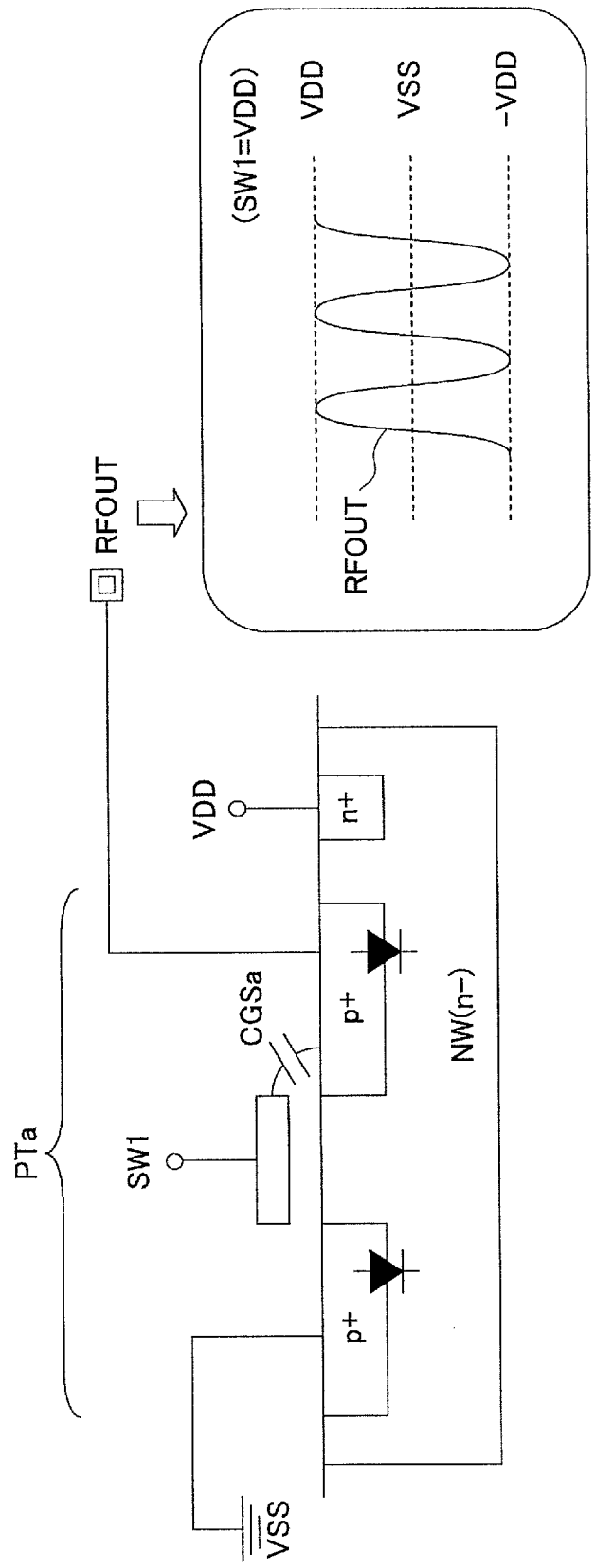
FIG. 2 is a schematic view illustrating an example of a cross-sectional structure of a pMOS transistor illustrated in FIG. 1 and an example of a waveform of a transmission signal output from an output terminal.

FIG. 2 is a schematic view illustrating an example of a cross-sectional structure of the pMOS transistor PTa illustrated in FIG. 1 and an example of a waveform of the transmission signal RF output from the output terminal RFOUT. The pMOS transistor PTa is manufactured, for example, by forming a pair of diffusion areas p+ (source and drain) on a well area NW (n−) on a silicon substrate, then forming a gate via an insulation film on the surface of the silicon substrate.

Symbols n− and n+ designate n-type diffusion areas, and a symbol p+ designates a p-type diffusion area. "−" indicates that impurity density is relatively low, and "+" indicates that impurity density is relatively high. The n-type diffusion area n+ is formed for supplying the power supply voltage VDD to the well area NW, which is the back gate of the pMOS transistor PTa. In FIG. 2, a p-n junction (parasitic diode) exists at the boundary between the diffusion area p+ connected with the output terminal RFOUT and the well area NW.

The transmission signal RF output from the output terminal RFOUT cycles, for example, centering around the ground voltage VSS with a maximum voltage of VDD and a minimum voltage of −VDD. According to the present embodiment, the back gate of pMOS transistor PTa is set to the power supply voltage VDD. Alternatively, the back gate of the pMOS transistor PTa may be set to a voltage higher than a voltage that is obtained by subtracting a forward direction voltage at which the p-n junction (parasitic diode) of the pMOS transistor becomes on, from the maximum voltage of the transmission signal RF. Thus, it is possible to prevent the parasitic diode from becoming on when the voltage of the transmission signal RF is high. As a result, it is possible to prevent the amplitude of the transmission signal RF from attenuating with the on-state of the parasitic diode when the pMOS transistor PTa is off.

Figure 3:
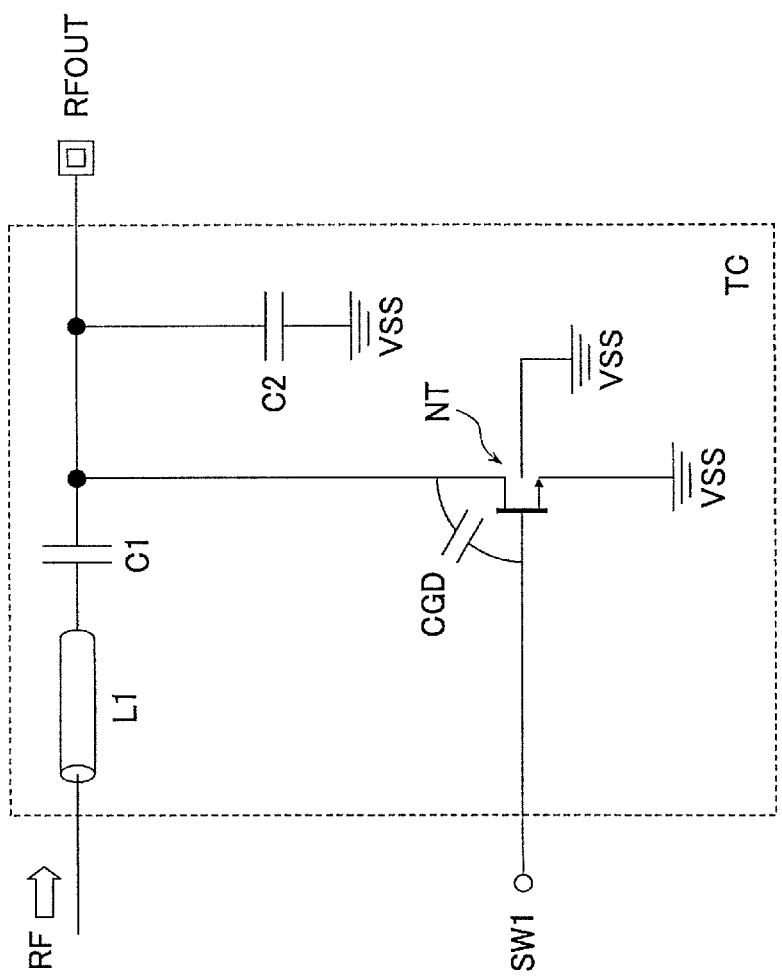
FIG. 3 is a schematic view illustrating another example of a termination circuit.

FIG. 3 is a schematic view illustrating another example of a termination circuit TC. Description of the same elements as in FIG. 1 is omitted. In this example, the termination circuit TC includes an nMOS (n-channel Metal Oxide Semiconductor) transistor NT instead of the pMOS transistor PTa in FIG. 1. The nMOS transistor NT has its drain connected with the output terminal RFOUT, and its source and back gate connected with the grounding line VSS, and its gate to receive a control signal SW1. The gate width and channel length of the nMOS transistor NT are designed so that the on-resistance between the source and drain becomes 50Ω when the control signal SW1 is set to a high level (for example, the power supply voltage VDD).

The control signal SW1 is set to an activation level (for example, VDD=1V) to turn on the nMOS transistor NT for enabling the characteristic impedance matching function of the termination circuit TC. The control signal SW1 is set to a non-activation level (for example, VDD=0V) to turn off the nMOS transistor NT for disabling the characteristic impedance matching function of the termination circuit TC.

Figure 4:
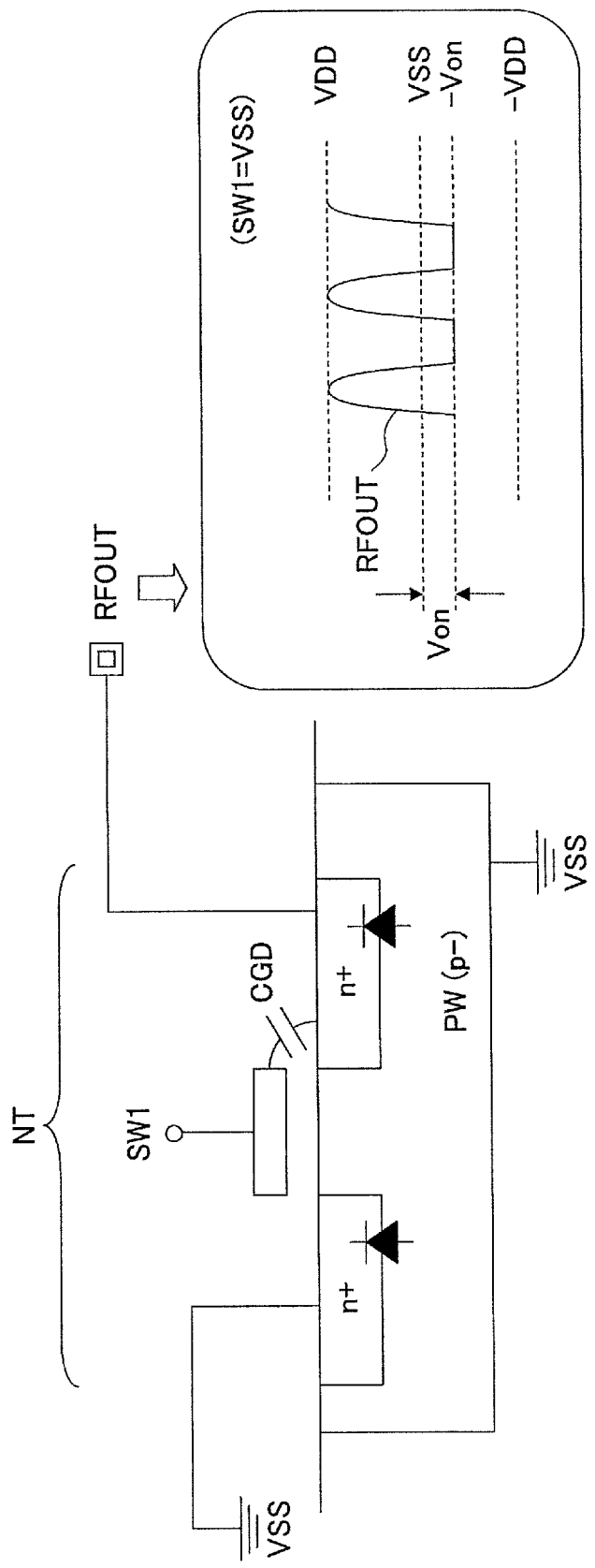
FIG. 4 is a schematic view illustrating an example of a cross-sectional structure of an nMOS transistor illustrated in FIG. 3 and an example of a waveform of a transmission signal output from an output terminal.

FIG. 4 is a schematic view illustrating an example of a cross-sectional structure of the nMOS transistor NT illustrated in FIG. 3 and an example of a waveform of the transmission signal RF output from the output terminal RFOUT. Description of the same elements as in FIG. 2 is omitted. The nMOS transistor NT is manufactured, for example, by forming a pair of diffusion areas n+ (source and drain) on a well area PW (p−) on a silicon substrate, then forming a gate via an insulation film on the surface of the silicon substrate. The well area PW, which is the back gate of the nMOS transistor NT, is connected to the grounding line VSS. In FIG. 4, a p-n junction (parasitic diode) exists at the boundary between the diffusion area n+ connected with the output terminal RFOUT and the well area PW.

In this example, the maximum voltage of the transmission signal RF output from the output terminal RFOUT is VDD, which is the same as in FIG. 2. The minimum voltage of the transmission signal RF is, however, not −VDD, which is a design value, but a value that subtracts a voltage Von (for example, 0.6 V) from the ground voltage VSS. Here, the voltage Von is a forward direction voltage required for turning on the parasitic diode. In this example, the parasitic diode turns on when the voltage of the transmission signal RF is below −Von, which hinders the transmission signal RF from taking the voltage −VDD. The amplitude of the transmission signal RF attenuates when the nMOS transistor NT, which would form the termination circuit TC, is turned off.

As above, according to the present embodiment, the characteristic impedance matching function of the termination circuit TCa can be switched between enabled and disabled states by turning on and off the pMOS transistor PTa with the control signal SW1. Thus, for example, it is possible to implement a state equivalent to the state where a termination resistor is attached, without actually connecting an external termination resistor, and to monitor the signal level of transmission signal RF at the output terminal RFOUT.

A deviation of the characteristic impedance caused by the parasitic capacitance CGSa can be canceled by the inductor L1a and capacitor C2a. Therefore, when the pMOS transistor PTa is off, it is possible to prevent the transmission signal RF from leaking to the gate via the parasitic capacitance CGSa. As a result, on/off ratio can be made greater, which is a ratio of the current value when pMOS transistor PTa is on and the current value (leakage current) when off.

When the pMOS transistor PTa is off, it is possible to prevent the transmission signal RF from leaking from the source of the pMOS transistor PTa to the back gate. This makes it possible to prevent the amplitude of the transmission signal RF from attenuating when the pMOS transistor PTa is off. As a result, it is possible to prevent performance of a semiconductor device SEM1 from being reduced if the on/off switchable termination circuit TCa is built in the semiconductor device SEM1.

Figure 5:
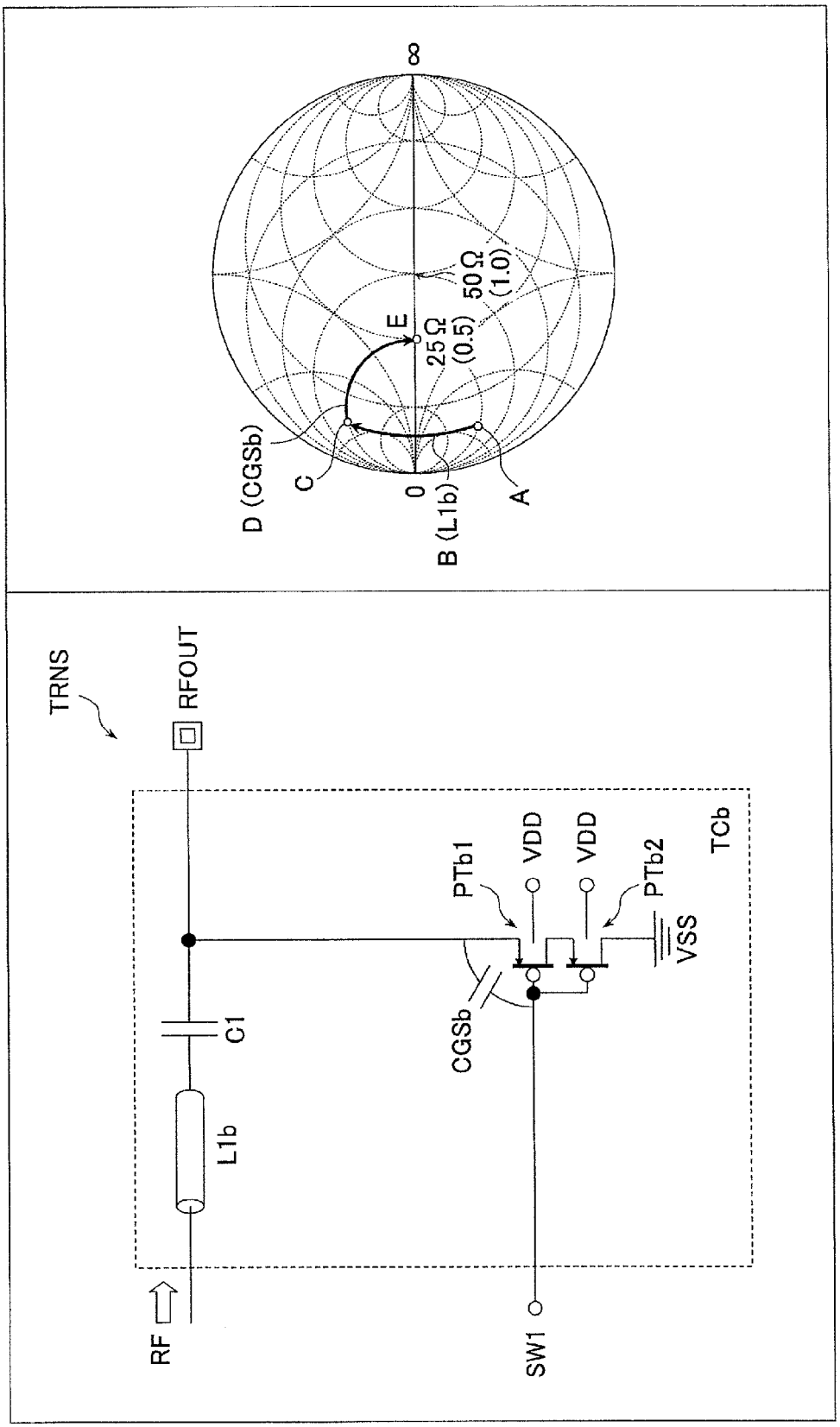
FIG. 5 is a schematic view illustrating an example of a termination circuit according to another embodiment.

FIG. 5 is a schematic view illustrating an example of a termination circuit TCb according to another embodiment. The same elements as in FIG. 1 are assigned with the same symbols, and their description is omitted. The termination circuit TCb is formed in the transmission circuit TRNS outputting a high-frequency transmission signal RF from the output terminal RFOUT, which is the same as in FIG. 1.

The termination circuit TCb includes an inductor L1b, a capacitor C1, and pMOS transistors PTb1 and PTb2. The inductor L1b and capacitor C1 are disposed between a generator of the transmission signal RF and the output terminal RFOUT in this order, which is the same as in FIG. 1.

The pMOS transistor PTb1 has its source connected with the output terminal RFOUT, its drain connected with the grounding line VSS via the pMOS transistor PTb2, and its back gate connected with the power source line VDD, and receives the control signal SW1 at its gate. The pMOS transistor PTb2 has its source connected with the drain of pMOS transistor PTb2, its drain connected with the grounding line VSS, and its back gate connected with the power source line VDD, and receives the control signal SW1 at its gate. The symbol CGSb denotes a parasitic capacitance generated between the gate and source of the pMOS transistor PTb1. Similarly to FIG. 1, the voltage of the control signal SW1 to turn on the pMOS transistors PTb1 and PTb2 is, for example, −VDD=−1V, the voltage of the control signal SW1 to turn off the pMOS transistors PTb1 and PTb2 is, for example, VDD=1V. The Smith chart illustrates the characteristic impedance of the pMOS transistors PTb1 and PTb2 in on-state at a predetermined frequency (for example, 77 GHz).

According to the present embodiment, the inductor L1b is designed first for tracing Trajectory B on the Smith chart. Next, the parasitic capacitance CGSb is calculated for tracing Trajectory D on the Smith chart, then the pMOS transistor PTb1 is designed that has the parasitic capacitance CGSb. Thus, the value of the on-resistance of the pMOS transistor PTb1 is determined. Next, the pMOS transistor PTb2 is designed so that the sum of the on-resistance of the pMOS transistor PTb1 and the on-resistance of the pMOS transistor PTb2 becomes 50Ω. This makes it possible to implement a state that is equivalent to the state where a termination resistor is connected with the output terminal RFOUT, without actually connecting such a termination resistor with the output terminal RFOUT.

Figure 6:
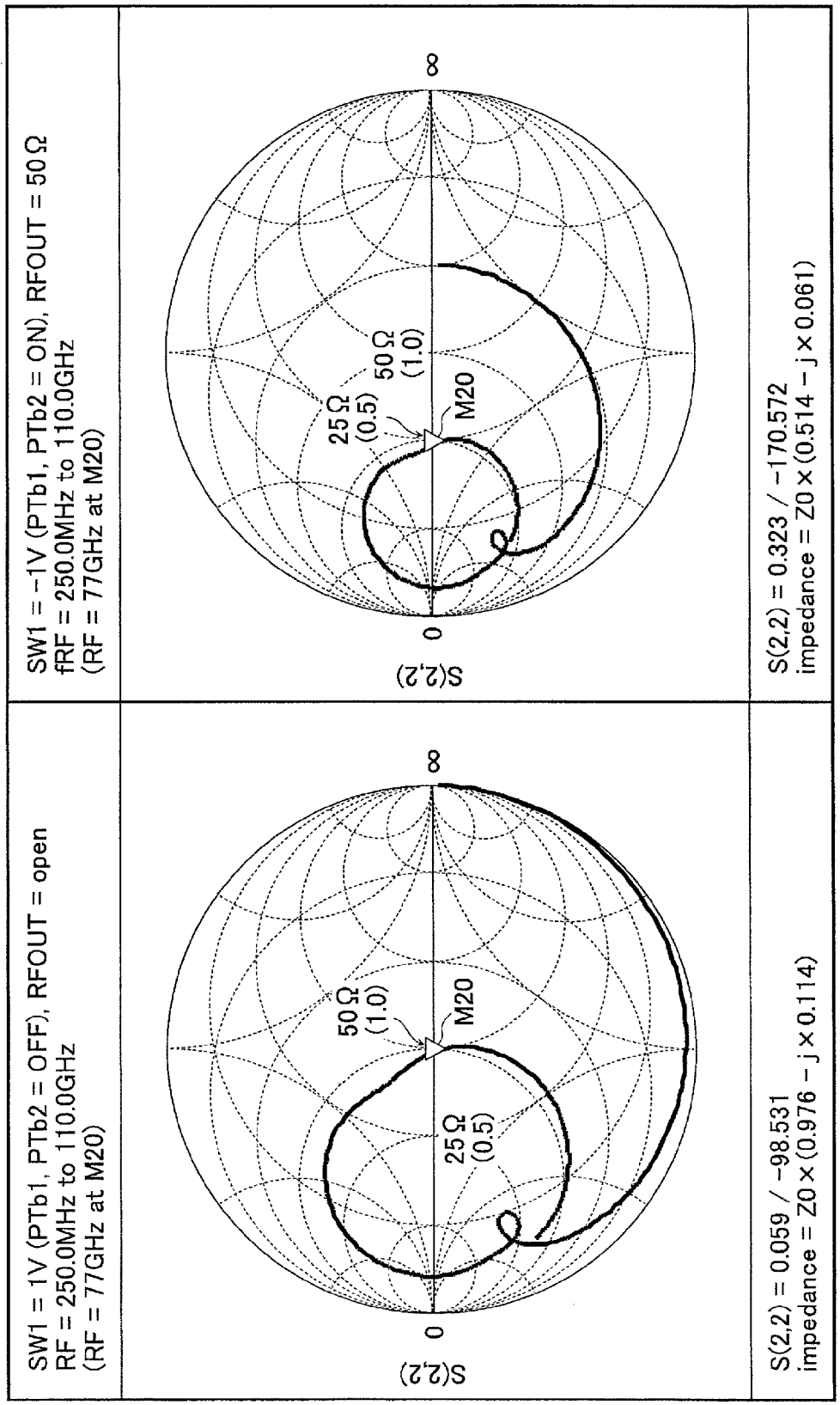
FIG. 6 is a schematic view illustrating an example of a simulation waveform of characteristic impedance in the termination circuit illustrated in FIG. 5.

FIG. 6 is a schematic view illustrating an example of a simulation waveform of the characteristic impedance of the termination circuit TCb illustrated in FIG. 5. On the left side in FIG. 6, a frequency characteristic of the characteristic impedance is illustrated in a state where the control signal SW1 is set to 1 V, and the pMOS transistors PTb1 and PTb2 are set off. The state where the pMOS transistors PTb1 and PTb2 are set off corresponds to a state where the termination circuit TCb (termination resistor) is disconnected with the output terminal RFOUT (RFOUT=open). On the right side in FIG. 6, a frequency characteristic of the characteristic impedance is illustrated in a state where the control signal SW1 is set to −1 V, and the pMOS transistors PTb1 and PTb2 are set on. The state where the pMOS transistors PTb1 and PTb2 are set on corresponds to a state where the termination circuit TCb (termination resistor) is connected with the output terminal RFOUT (RFOUT=50Ω).

Thick curves in the Smith charts illustrate changes of the characteristic impedance when changing the frequency of the transmission signal RF from 250 MHz to 110 GHz. Triangular markers M20 designate the characteristic impedance of the transmission signal RF at the frequency of 77 GHz. Values in the lower part in FIG. 6 represent S parameter (S(2, 2)) and the characteristic impedance obtained with a simulation. Here, the characteristic impedance Z0 in the formula is 50Ω, and j in the formulae denotes the unit of imaginary number.

On the left side in FIG. 6 where the termination circuit TCb is disconnected with the output terminal RFOUT, the characteristic impedance at the frequency of 77 GHz is about 50Ω. This value is the characteristic impedance (output impedance) of the transmission circuit TRNS with respect to the output terminal RFOUT. On the right side in FIG. 6 where the termination circuit TCb is connected with the output terminal RFOUT, the characteristic impedance at the frequency of 77 GHz is about 25Ω. This state is equivalent to the state where an external termination resistor of 50Ω is connected with the output terminal RFOUT. Namely, this makes it possible to implement a state that is equivalent to the state where a termination resistor is connected with the output terminal RFOUT, without actually connecting such a termination resistor with the output terminal RFOUT. As above, substantially the same effects as the above embodiments can be obtained according to the present embodiment.

Figure 7:
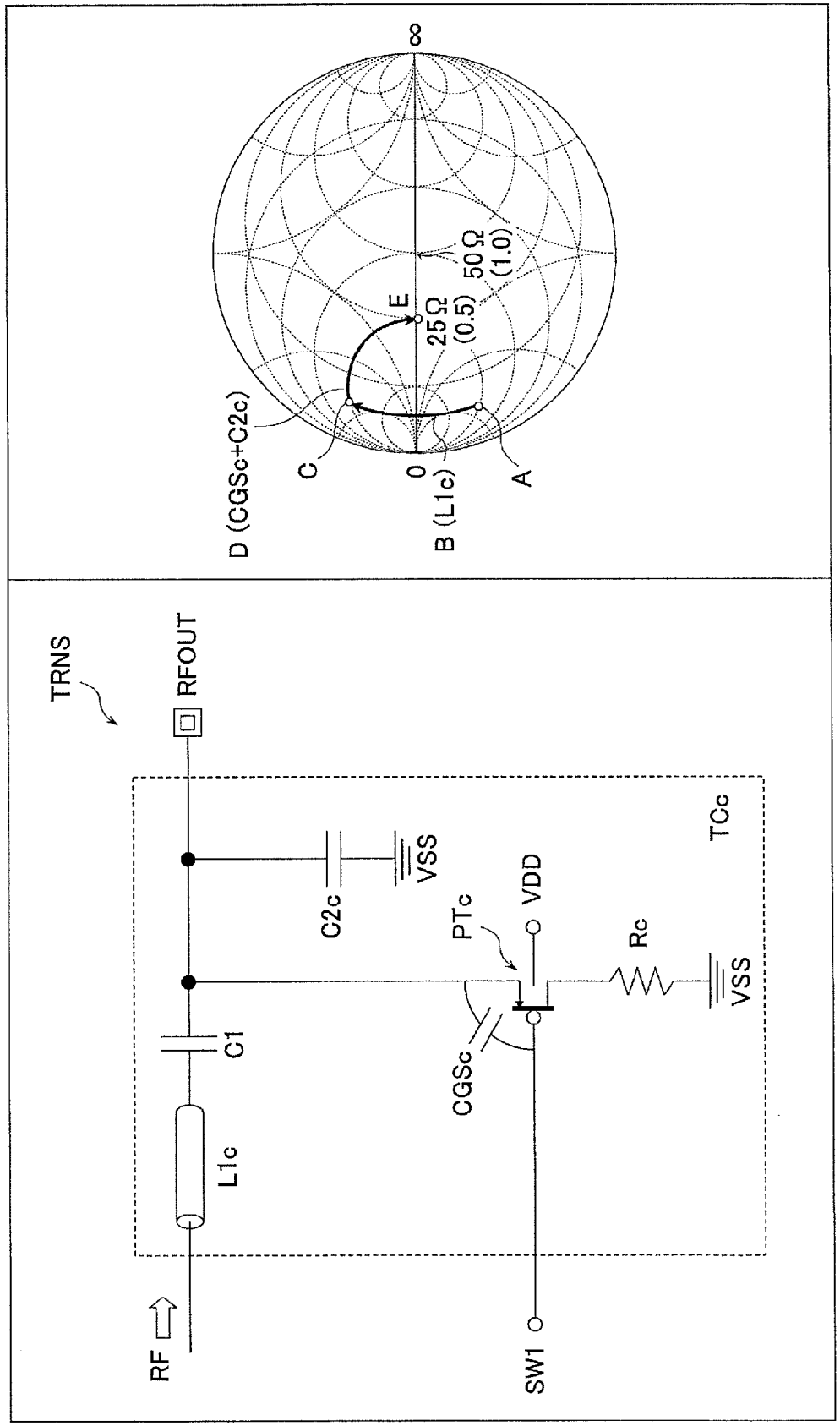
FIG. 7 is a schematic view illustrating an example of a termination circuit according to another embodiment.

FIG. 7 is a schematic view illustrating an example of a termination circuit according to another embodiment. The same elements as in FIG. 1 and FIG. 5 are assigned with the same symbols, and their description is omitted. The termination circuit TCc is formed in the transmission circuit TRNS outputting a high-frequency transmission signal RF from the output terminal RFOUT, which is the same as in FIG. 1.

The termination circuit TCc includes an inductor L1c, capacitors C1 and C2c, a pMOS transistor PTc, and a resistance element Rc. The inductor L1c and capacitor C1 are disposed between a generator of the transmission signal RF and the output terminal RFOUT in this order, which is similar to FIG. 1, and the capacitor C2c is disposed between the output terminal RFOUT and the grounding line VSS. The pMOS transistor PTc is disposed between the output terminal RFOUT and the grounding line VSS. The pMOS transistor PTc turns on when receiving the control signal SW1 at the activation level (for example, −VDD=−1V) at the gate, and turns off when receiving the control signal SW1 at the non-activation level (for example, VDD=1V) at the gate. The resistance element Rc may be formed using a wiring resistance of polysilicon or the like, although it is not limited to that. The on-resistance of the pMOS transistor PTc and the resistance element Rc are designed to have the summed resistance value of 50Ω. The Smith chart illustrates a characteristic impedance of the pMOS transistor PTc when it is in an on-state at the predetermined frequency (for example, 77 GHz).

According to the present embodiment, the characteristic impedance draws Trajectory B with the inductor L1c, and Trajectory D with the parasitic capacitance CGSc and the capacitor C2c. Point E designates 25Ω on the axis of the resistance value. Therefore, similarly to FIG. 1 and FIG. 5, it is possible to implement a state that is equivalent to the state where a termination resistor is connected with the output terminal RFOUT, without actually connecting such a termination resistor with the output terminal RFOUT. As above, substantially the same effects as the above embodiments can be obtained according to the present embodiment.

Figure 8:
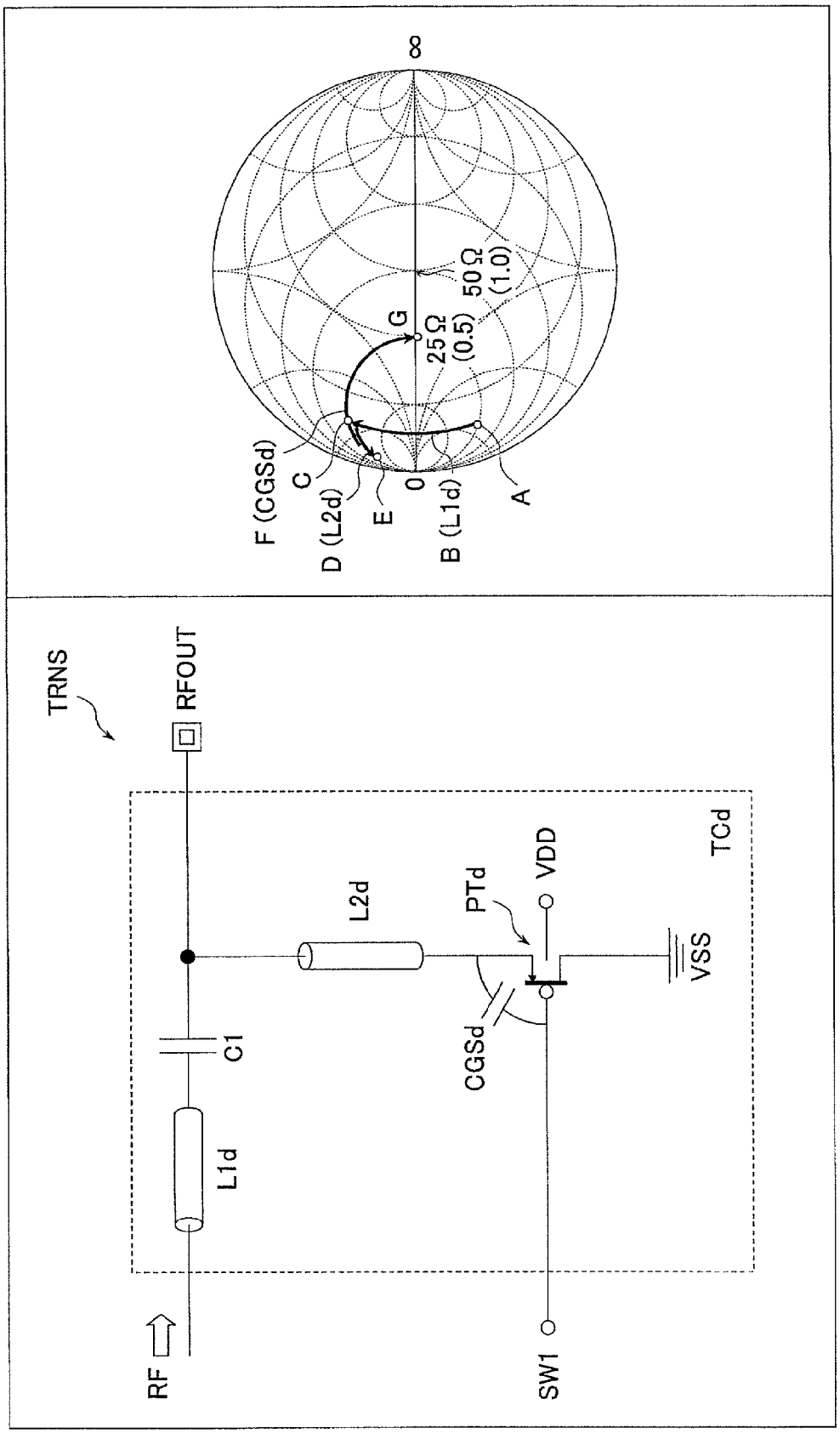
FIG. 8 is a schematic view illustrating an example of a termination circuit according to another embodiment.

FIG. 8 is a schematic view illustrating an example of a termination circuit according to another embodiment. The same elements as in FIG. 1 are assigned with the same symbols, and their description is omitted. The termination circuit TCd is formed in the transmission circuit TRNS outputting a high-frequency transmission signal RF from the output terminal RFOUT, which is the same as in FIG. 1.

The termination circuit TCd includes inductors L1d and L2d, a capacitor C1, and a pMOS transistor PTd. The inductor L1d and capacitor C1 are disposed between a generator of the transmission signal RF and the output terminal RFOUT in this order, which is the same as in FIG. 1. For example, the inductance of the inductor L1d may be the same as the inductance of the inductor L1a illustrated in FIG. 1. The pMOS transistor PTd is disposed between the output terminal RFOUT and the grounding line VSS via the inductor L2d. The pMOS transistor PTd turns on when receiving the control signal SW1 at the activation level (for example, −VDD=−1V) at the gate, and turns off when receiving the control signal SW1 at the non-activation level (for example, VDD=1V) at the gate. The on-resistance of the pMOS transistor PTd is designed to take 50Ω. The Smith chart illustrates the characteristic impedance of the pMOS transistor PTd, when it is in an on-state at the predetermined frequency (for example, 77 GHz).

In this example, the value of the parasitic capacitance CGSd of the pMOS transistor PTd is greater than the value of the parasitic capacitance CGSa of the pMOS transistor PTa illustrated in FIG. 1. In the Smith chart, to compensate for the amount of change of the characteristic impedance corresponding to the difference of the capacitance values between the parasitic capacitances CGSd and CGSc, the inductor L2d (corresponding to Trajectory D from Point C to Point E) is provided in parallel with the transfer path of the transmission signal RF. This makes the characteristic impedance be positioned at Point G (25Ω) after travelling along Trajectory B, Point C, Trajectory D, Point E, and Trajectory F. Namely, by turning on the pMOS transistor PTd, a state can be obtained that is equivalent to the state where a termination resistor of 50Ω is connected with the output terminal RFOUT. As above, substantially the same effects as the above embodiments can be obtained according to the present embodiment.

Figure 9:
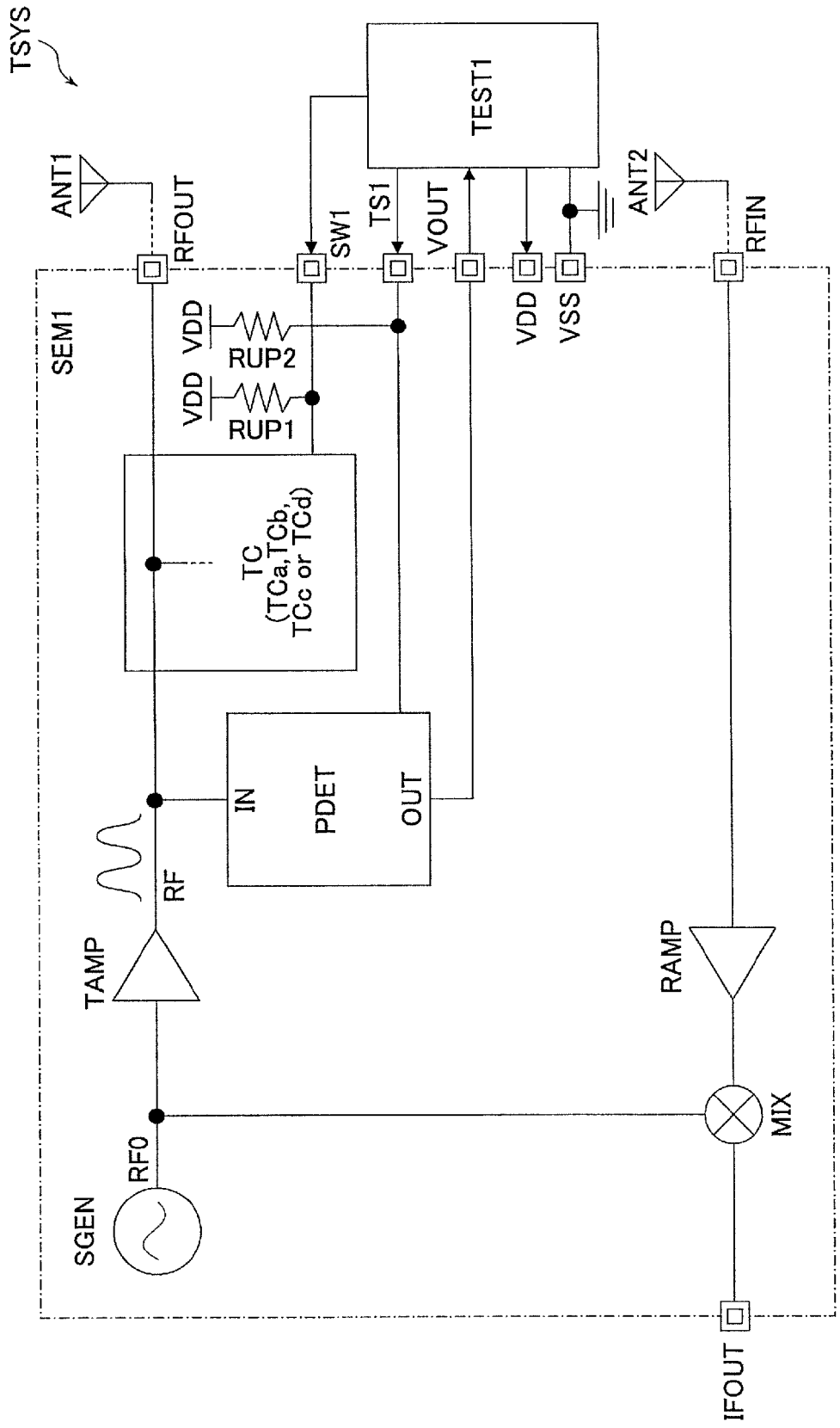
FIG. 9 is a schematic view illustrating a semiconductor device equipped with a termination circuit and a test system for testing the semiconductor device according to an embodiment.

FIG. 9 is a schematic view illustrating a semiconductor device equipped with a termination circuit according to the above embodiments and a test system for testing the semiconductor device according to an embodiment. A semiconductor device SEM1 includes a signal generator SGEN, a sending amplifier TAMP, a power detection circuit PDET, a termination circuit TC, pull-up resistors RUP1 and RUP2, a receiving amplifier RAMP, and a mixer MIX. A test system TSYS is implemented by connecting a test device TEST1 with the semiconductor device SEM1.

The signal generator SGEN receives the power supply voltage VDD to generate a high-frequency reference signal RF0 that is supplied to the sending amplifier TAMP and mixer MIX. The sending amplifier TAMP amplifies the reference signal RF0 to generate a transmission signal RF. The signal generator SGEN and sending amplifier TAMP are an example of a generating circuit to generate the transmission signal RF output from the output terminal RFOUT.

Figure 10:
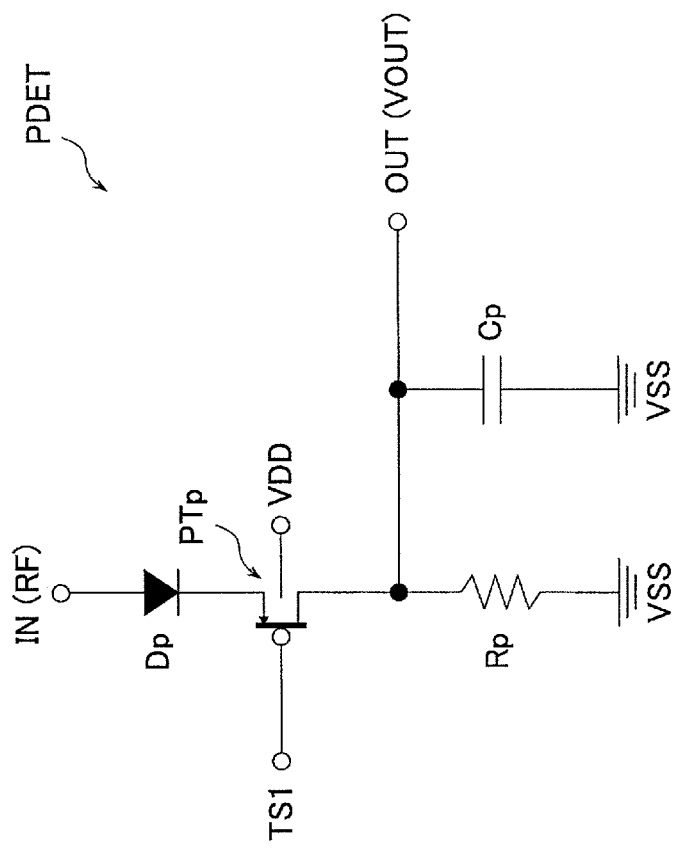
FIG. 10 is a schematic view illustrating an example of a power detection circuit illustrated in FIG. 9.

The power detection circuit PDET has an input terminal IN connected with the output terminal RFOUT outputting the transmission signal RF, and an output terminal OUT connected with the monitor terminal VOUT. The power detection circuit PDET operates when receiving a test signal TS1 at an activated state (for example, low-level=−1V), monitors the electric power of the transmission signal RF, and outputs a signal value indicating the value of the monitored electric power to the external terminal VOUT. For example, the signal value indicating the value of the monitored electric power may be a voltage value, or a digital value. The power detection circuit PDET stops monitoring the electric power of the transmission signal RF when receiving the test signal TS1 at a non-activated state (for example, high level=1V). An example of the power detection circuit PDET is illustrated in FIG. 10.

The termination circuit TC is one of the termination circuits TCa, TCb, TCc, and TCd illustrated in FIG. 1, FIG. 5, FIG. 7, and FIG. 8, respectively. The pull-up resistor RUP1 is a high-resistance element to pull up the control terminal SW1 of the termination circuit TC to the power supply voltage VDD. The pull-up resistor RUP2 is a high-resistance element to pull up the control terminal of the power detection circuit PDET to the power supply voltage VDD.

The signal generator SGEN, the sending amplifier TAMP, the termination circuit TC, and the pull-up resistors RUP1 and RUP2 are included in the transmission circuit TRNS illustrated in FIG. 1, FIG. 5, FIG. 7, and FIG. 8. The semiconductor device SEM1 is built in a communication device such as a cellular phone, an on-board radar, and the like. The pull-up resistor RUP1 is provided for keeping an off-state of the pMOS transistors PTa, PTb, PTc, and PTd illustrated in FIG. 1, FIG. 5, FIG. 7, and FIG. 8, respectively, when the test device TEST1 is not connected with the semiconductor device SEM1. This makes it possible to prevent the characteristic impedance from being deviated by electrically disconnecting the termination circuit TC with the output terminal RFOUT when, for example, the semiconductor device SEM1 operates as a communication device. The pull-up resistor RUP2 is provided for stopping an operation of the power detection circuit PDET when the test device TEST1 is not connected with semiconductor device SEM1.

The receiving amplifier RAMP amplifies a high-frequency transmission signal that is received via the input terminal RFIN, and outputs the amplified signal to the mixer MIX. The mixer MIX mixes the signal from the receiving amplifier RAMP and the reference signal RF0, and outputs the mixed signal as an intermediate-frequency signal IFOUT. The receiving amplifier RAMP and mixer MIX is an example of a processing circuit for a high-frequency transmission signal that is input to the input terminal RFIN, which is included in a receiver circuit.

The semiconductor device SEM1 operates as a part of a communication device such as a cellular phone, an on-board radar, and the like by connecting the output terminal RFOUT and input terminal RFIN with antennas ANT1 and ANT2, respectively. Here, the output terminal RFOUT and input terminal RFIN may be connected with a common antenna.

The test device TEST1 is, for example, an LSI tester that supplies the control signal SW1, the test signal TS1, and the power supply voltage VDD (for example, 1V) to the semiconductor device SEM1 when testing the semiconductor device SEM1, and receives the monitor signal VOUT from the semiconductor device SEM1. The test device TEST1 sets, for example, the control signal SW1 and the test signal TS1 to −1V during a test, or the control signal SW1 to 1V and the test signal TS1 to 1V when not executing a test.

The semiconductor device SEM1 determines whether operations of the signal generator SGEN and sending amplifier TAMP are defective in response to the monitor signal VOUT that indicates the value of the electric power of the transmission signal RF. For example, if the value of the electric power indicated by the monitor signal VOUT is less than a predetermined value, the signal generator SGEN or the sending amplifier TAMP is determined as defective. The semiconductor device SEM1 treats the semiconductor device SEM1 as a defective unit if the signal generator SGEN or the sending amplifier TAMP is determined as defective with the monitor signal VOUT.

FIG. 10 is a schematic view illustrating an example of the power detection circuit PDET illustrated in FIG. 9. The power detection circuit PDET includes a diode Dp and a pMOS transistor PTp disposed in series between the input terminal IN and the output terminal OUT, a resistance element Rp and a capacitor Cp disposed in parallel between the output terminal OUT and the grounding line VSS.

The pMOS transistor PTp turns on when receiving the test signal TS1 at the activation level (for example, −VDD=−1V) at the gate, and turns off when receiving the test signal TS1 at the non-activation level (for example, VDD=1V) at the gate.

The power detection circuit PDET operates as a smoothing circuit that smoothes the voltage value of the transmission signal RF received at the input terminal IN while the pMOS transistor PTp is on. The power detection circuit PDET outputs the generated, smoothed voltage as a value indicating the electric power of the transmission signal RF via the output terminal OUT to the monitor terminal VOUT. The pull-up resistor RUP2 illustrated in FIG. 9 is provided for stopping operation of the power detection circuit PDET by securely turning off the pMOS transistor PTp when the test device TEST1 is not connected with the semiconductor device SEM1.

Figure 11:
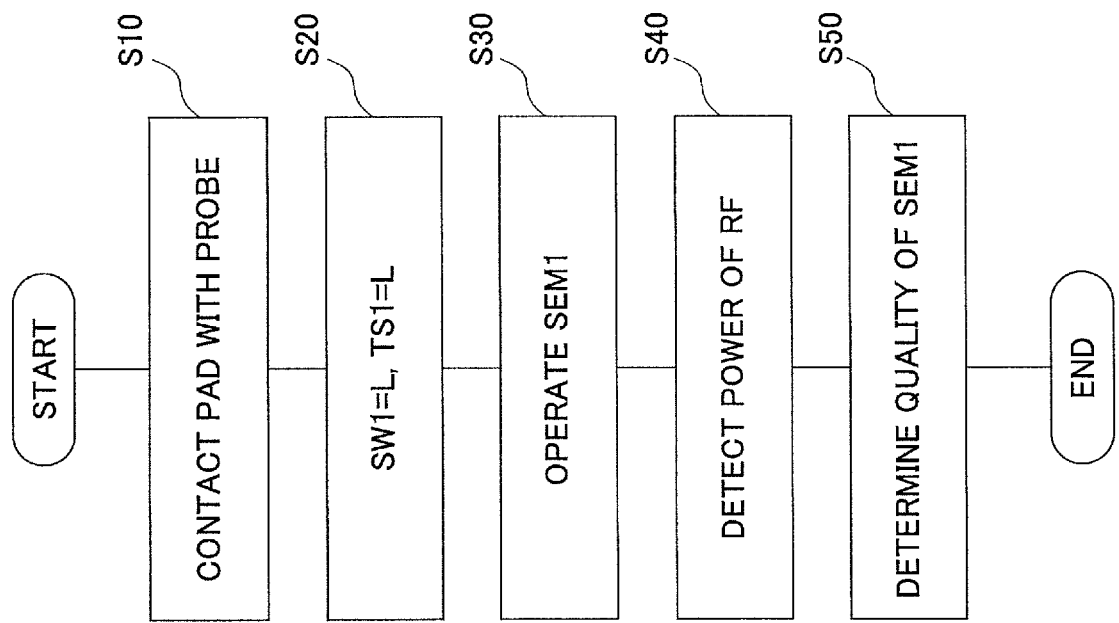
FIG. 11 is a schematic view illustrating an example of a test flow of a semiconductor device performed by the test system illustrated in FIG. 9.

FIG. 11 is a schematic view illustrating an example of a test flow of the semiconductor device SEM1 executed by the test system TSYS illustrated in FIG. 9. The flow in FIG. 11 illustrates operations executed by the test device TEST1, which is performed during a manufacturing process of the semiconductor device SEM1. Namely, the flow in FIG. 11 illustrates a part of a manufacturing method of the semiconductor device SEM1.

First, at Step S10, the test device TEST1 has a probe touch a pad (external terminal) of the semiconductor device SEM1. Here, the probe is a probe of a probe card that is attached to a general-purpose test device such as a logic tester, which is cheaper than a probe for high frequency. Also, with a test device such as a logic tester, pads of multiple semiconductor devices SEM1 can be touched by the probes at the same time so that the multiple semiconductor devices SEM1 can be tested at the same time. This can shorten the test time and reduce the test cost.

Next, at Step S20, the test device TEST1 sets the control signal SW1 and test signal TS1 to a low level. This makes the pMOS transistor (for example, PTa in FIG. 1) of the termination circuit TC turn on, which makes the semiconductor device SEM1 become in a state that is equivalent to the state where a termination resistor is externally connected with the output terminal RFOUT.

At Step S30, the test device TEST1 has the signal generator SGEN, the sending amplifier TAMP, and the like of the semiconductor device SEM1 operate to generate the transmission signal RF at the semiconductor device SEM1. For example, the semiconductor device SEM1 starts generating the transmission signal RF in response to receiving the power supply voltage VDD at the signal generator SGEN and sending amplifier TAMP. Alternatively, the semiconductor device SEM1 starts its operation in response to receiving a start signal at the signal generator SGEN when receiving the power supply voltage VDD, to generate the transmission signal RF. The power detection circuit PDET monitors the electric power of the transmission signal RF, and outputs the value of the monitored electric power, for example, as a voltage value to the monitor terminal VOUT. Here, Steps S20 and S30 may be executed in reverse order.

Next, at Step S40, the test device TEST1 detects the electric power value of the transmission signal RF based on the voltage value received via the monitor terminal VOUT. Next, at Step S50, the test device TEST1 determines whether the semiconductor device SEM1 is defective based on the detected electric power value. For example, a test by the test device TEST1 is performed using a wafer on which multiple chips of the semiconductor devices SEM1 are formed. A semiconductor device SEM1 determined as good by the test is cut from the wafer, then assembled in a communication device with other semiconductor chips and parts.

As above, substantially the same effects as the above embodiments can be obtained according to the present embodiment. Moreover, by operating the power detection circuit PDET when the characteristic impedance matching function of the termination circuit TC is enabled, it is possible to monitor the electric power of the transmission signal RF in a state that is equivalent to the state where an external termination resistor is connected, and to confirm that the signal generator SGEN and sending amplifier TAMP operate normally. Namely, without using expensive high-frequency probes or the like, it is possible to realize a state that is equivalent to the state where an antenna ANT1 is connected, and to perform a self test of the semiconductor device SEM1. As a result, the test time of the semiconductor device SEM1 can be reduced, and the test cost can be reduced.

It is possible to prevent the characteristic impedance matching function of the termination circuit TC from being enabled in a state where the semiconductor device SEM1 is built in a system because the pull-up resistor RUP1 is connected with the control terminal SW1. Also, it is possible to prevent the power detection circuit PDET from operating in a state where the semiconductor device SEM1 is built in a system because the pull-up resistor RUP2 is connected with the test terminal TS2. This makes it possible to prevent the amplitude of the transmission signal RF from being attenuated, and to prevent the performance of the semiconductor device SEM1 and system from being reduced. Moreover, it is possible to prevent the power consumption of the semiconductor device SEM1 from increasing.

Figure 12:
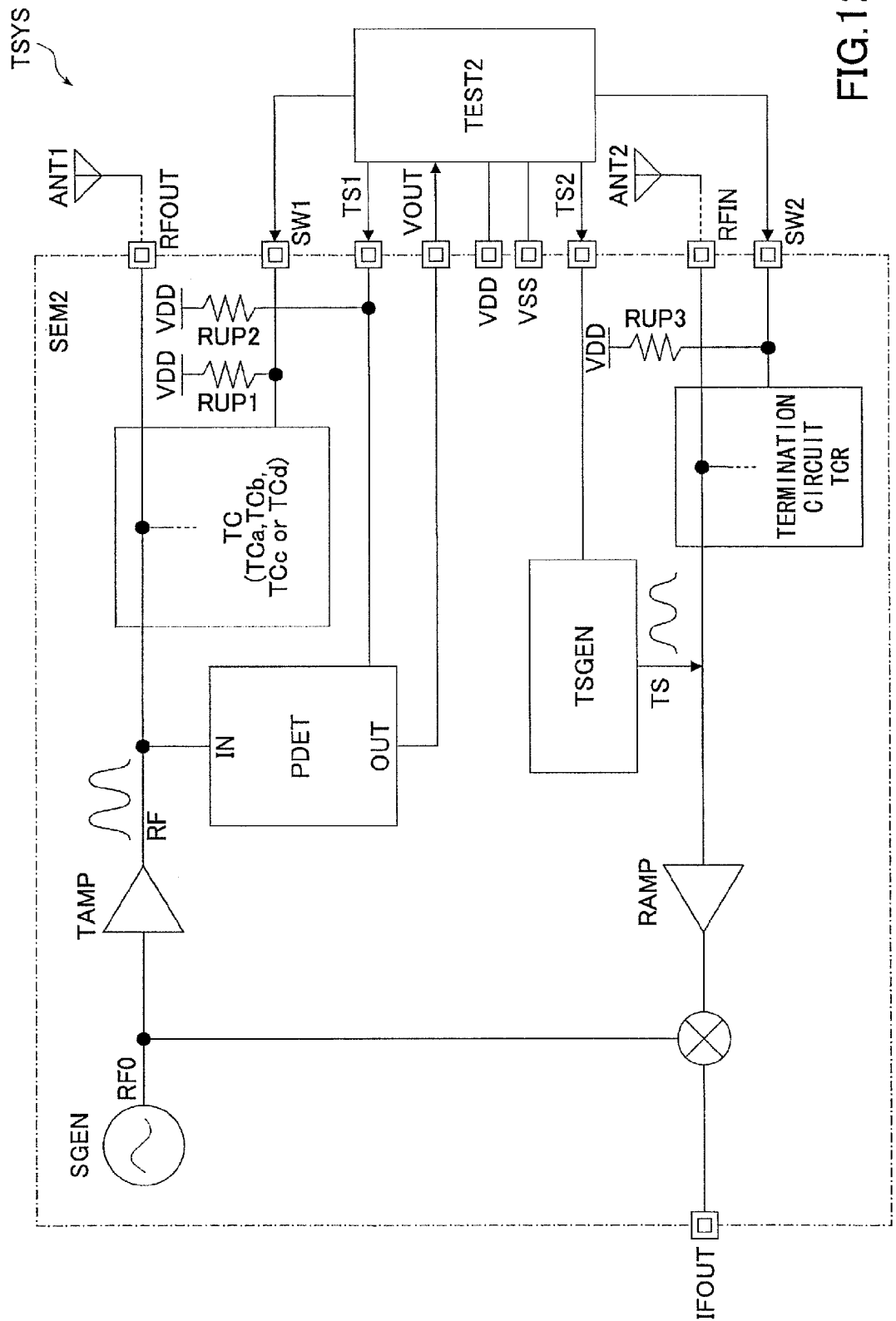
FIG. 12 is a schematic view illustrating a semiconductor device equipped with a termination circuit and a test system for testing the semiconductor device according to another embodiment.

FIG. 12 is a schematic view illustrating a semiconductor device equipped with a termination circuit according to the above embodiments and a test system for testing the semiconductor device according to another embodiment. The same elements as in FIG. 9 are assigned with the same symbols, and their description is omitted.

The semiconductor device SEM2 includes a termination circuit TCR, a test signal generating circuit TSGEN, and a pull-up resistor RUP3 in addition to the semiconductor device SEM1 illustrated in FIG. 9. The other configuration elements of the semiconductor device SEM2 are substantially the same as those of the semiconductor device SEM1 illustrated in FIG. 9 except that the test terminal TS2 and control terminal SW2 are added. The semiconductor device SEM2 operates as a part of a communication device such as a cellular phone, an on-board radar, and the like by connecting the output terminal RFOUT and input terminal RFIN with antennas ANT1 and ANT2, respectively.

The termination circuit TCR is one of the termination circuits TCa, TCb, TCc, and TCd illustrated in FIG. 1, FIG. 5, FIG. 7, and FIG. 8, respectively. However, the inductances of the inductors L1a, L1b, L1c, L1d, and L2d in the termination circuit TCR differ from the inductances of the inductors attached with the same symbols in the termination circuits TCa, TCb, TCc, and TCd illustrated in FIG. 1, FIG. 5, FIG. 7, and FIG. 8, respectively. Similarly, the capacitances of capacitors C2a and C2c in the termination circuit TCR differ from the capacitances of the capacitors attached with the same symbols in the termination circuits TCa, TCb, TCc, and TCd illustrated in FIG. 1, FIG. 5, FIG. 7, and FIG. 8, respectively. In the termination circuit TCR, a node that is connected with the output terminal RFOUT in FIG. 1 or the like is connected with the input terminal RFIN, a node receiving the transmission signal RF is connected with the input of the receiving amplifier RAMP, and the control terminal SW1 receives the control signal SW2.

For example, the control signal SW2 is set to an activation level (for example, −VDD=−1V) when enabling the characteristic impedance matching function of the termination circuit TCR. The control signal SW2 is set to a non-activation level (for example, VDD=1V) when disabling the characteristic impedance matching function of the termination circuit TCR.

The termination circuit TCR is enabled when the receiving amplifier RAMP and mixer MIX execute an operation test, and disabled when the semiconductor device SEM2 built in a system operates as a part of the system.

The test signal generating circuit TSGEN generates a test signal TS having the same frequency and electric power as the transmission signal that is received by a communication device equipped with the semiconductor device SEM2 at the input terminal RFIN via the antenna ANT2, which is output to the receiving amplifier RAMP. Here, the test signal generating circuit TSGEN operates when receiving the test signal TS2 at the activation level for starting a receiving test.

The receiving amplifier RAMP amplifies the test signal TS, and outputs the amplified signal to the mixer MIX. The mixer MIX mixes the test signal TS amplified by the receiving amplifier RAMP and the reference signal RF0, to output it as an intermediate-frequency signal IFOUT. Then, by analyzing the characteristic of the intermediate-frequency signal IFOUT with a test device TEST2 or the like, it is possible to perform an operation test of the receiving amplifier RAMP and mixer MIX without receiving the transmission signal from the outside of the semiconductor device SEM2. Here, the test signal generating circuit TSGEN, stops generating the test signal TS when receiving the test signal TS2 at the non-activated state.

The pull-up resistor RUP3 is a high-resistance element to pull up the test terminal TS2 to the power supply voltage VDD. The pull-up resistor RUP3 is provided for stopping an operation of the test signal generating circuit TSGEN when the test device TEST2 is not connected with semiconductor device SEM2.

The test device TEST2 is, for example, an LSI tester that supplies the control signals SW1 and SW2, the test signals TS1 and TS2, and the power supply voltage VDD (for example, 1 V) to the semiconductor device SEM2 when testing the semiconductor device SEM2, and receives the monitor signal VOUT from the semiconductor device SEM2. The test device TEST2 has a function for outputting the test signal TS2 in addition to the functions of the test device TEST1 illustrated in FIG. 9. The other functions of the test device TEST2 are the same as the functions of the test device TEST1. For example, the test device TEST2 executes the flow illustrated in FIG. 11 when determining whether the signal generator SGEN and sending amplifier TAMP are defective by monitoring the electric power of the transmission signal RF.

As above, substantially the same effects as the above embodiments can be obtained according to the present embodiment. Moreover, by operating the test signal generating circuit TSGEN when the characteristic impedance matching function of the termination circuit TC is enabled, it is possible to supply the high-frequency test signal TS to the receiving amplifier RAMP in a state that is equivalent to the state where an external termination resistor is connected. Namely, without connecting an external termination resistor to the input terminal RFIN, it is possible to realize a state that is equivalent to the state where an antenna ANT2 is connected, and to perform an operation test of the receiving amplifier RAMP and mixer MIX.

It is possible to prevent the characteristic impedance matching function of the termination circuit TCR from turning on in a state where the semiconductor device SEM2 is built in a system because the pull-up resistor RUP3 is connect with the control terminal SW2.

Figure 13:
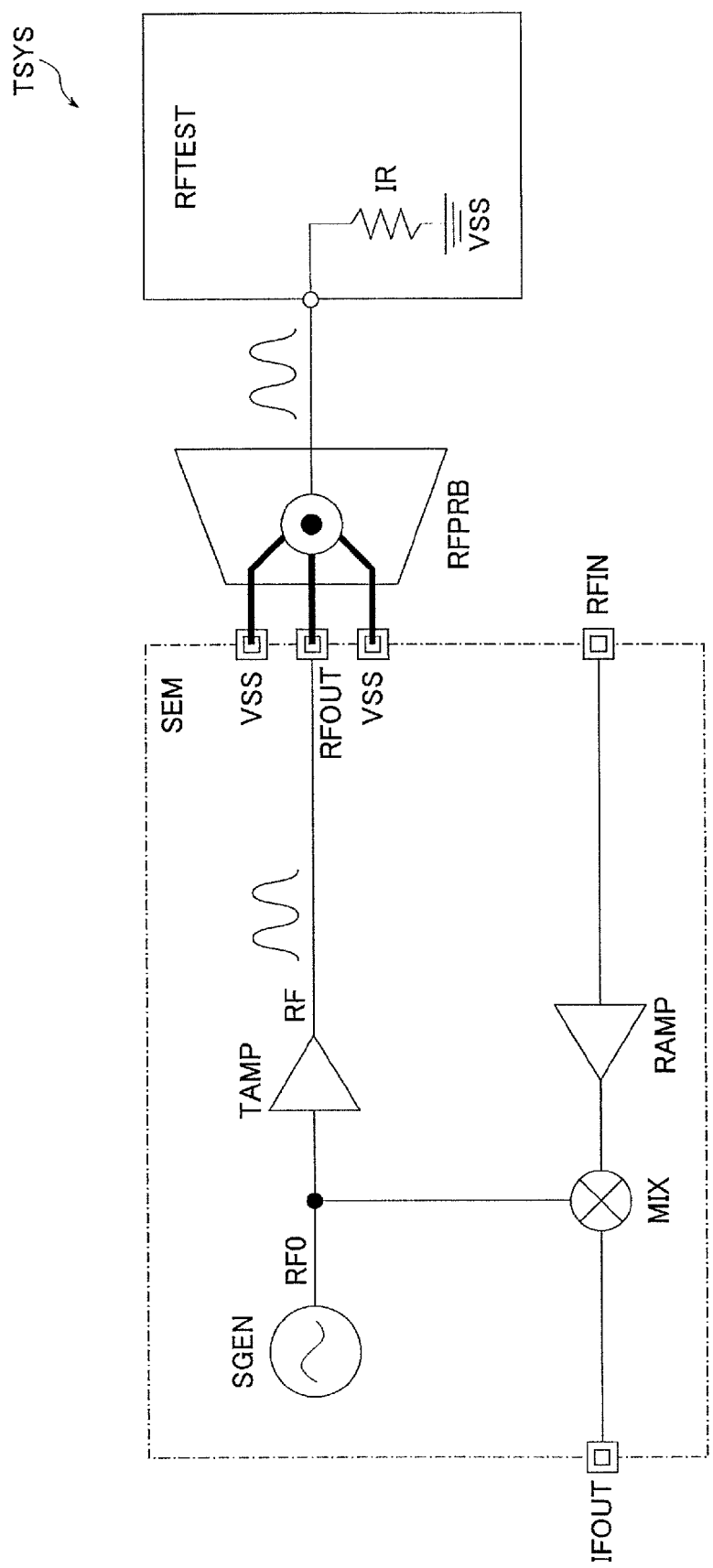
FIG. 13 is a schematic view illustrating another example of a test system for testing a semiconductor device.

FIG. 13 is a schematic view illustrating another example of a test system for testing a semiconductor device. For example, a semiconductor device SEM tested by the test system TSYS is configured by removing the termination circuit TC, the power detection circuit PDET, and the pull-up resistors RUP1 and RUP2 from the semiconductor device SEM1 illustrated in FIG. 9. If the termination circuit TC is not formed in the semiconductor device SEM, the output terminal RFOUT is connected with a test device RFTEST via a probe RFPRB for high-frequency.

The probe RFPRB has a signal line for a transmission signal RF shielded with the grounding line VSS, and has its characteristic impedance set to 50Ω. The probe RFPRB is more expensive than the probe used in the test system TSYS illustrated in FIG. 9, and has a restriction that it cannot be connected with multiple signal pads at the same time. The test device RFTEST is terminated with, for example, an internal resistance IR of 50Ω for measuring the characteristic of the transmission signal RF received via the probe RFPRB. In general, the test device RFTEST for high-frequency is more expensive than test devices such as a logic tester or the like, and has fewer pins that can be measured at the same time. Therefore, with a test using the probe RFPRB and test device RFTEST, the test time becomes longer and the test cost becomes higher.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A termination circuit comprising:
   a pMOS transistor configured to have a source connected with a signal terminal outputting or inputting a transmission signal, a drain connected with a grounding line, and a gate receiving a control signal, the pMOS transistor being turned on when enabling a characteristic impedance matching function and being turned off when disabling the matching function; and
   an inductor and a capacitor configured to be connected with the signal terminal for matching characteristic impedance,
   wherein a back gate of the pMOS transistor receives a voltage higher than a voltage obtained by subtracting a forward direction voltage to make a p-n junction of the pMOS transistor turn on, from a maximum voltage of the transmission signal.

2. The termination circuit as claimed in claim 1, further comprising:
   a resistance element configured to be disposed between the drain of the pMOS transistor and the grounding line.

3. A semiconductor device comprising:
   a termination circuit including
      a pMOS transistor configured to have a source connected with a signal terminal outputting or inputting a transmission signal, a drain connected with a grounding line, and a gate receiving a control signal, the pMOS transistor being turned on when enabling a characteristic impedance matching function and being turned off when disabling the matching function, and
      an inductor and a capacitor configured to be connected with the signal terminal for matching characteristic impedance;
   a generating circuit configured to be connected with the signal terminal of the termination circuit for generating the transmission signal output from the signal terminal;
   a control terminal configured to receive the control signal; and
   a power detection circuit configured to be connected with the signal terminal for monitoring electric power of the transmission signal to output a signal value indicating a value of the monitored electric power.

4. The semiconductor device as claimed in claim 3, further comprising:
   a resistance element configured to be disposed between a first voltage line having a first voltage and the control terminal,
   wherein the pMOS transistor turns off when receiving the first voltage at the gate if the control terminal is in an open state.

5. The semiconductor device as claimed in claim 3, further comprising:
   a test terminal configured to receive a test signal,
   wherein the power detection circuit monitors the electric power of the the transmission signal when receiving the test signal at an activated state at the test terminal, or stops monitoring the electric power when receiving the test signal at a non-activated state at the test terminal.

6. A test system comprising:
   the semiconductor device as claimed in claim 3; and
   a test device configured to supply the control signal to the semiconductor device for enabling the characteristic impedance matching function, and to determine whether an operation of the generating circuit is defective in response to receiving the signal indicating the electric power value output from the power detection circuit.

7. A semiconductor device comprising:
   a termination circuit including
      a pMOS transistor configured to have a source connected with a signal terminal outputting or inputting a transmission signal, a drain connected with a grounding line, and a gate receiving a control signal, the pMOS transistor being turned on when enabling a characteristic impedance matching function and being turned off when disabling the matching function, and
      an inductor and a capacitor configured to be connected with the signal terminal for matching characteristic impedance;
   a processing circuit configured to be connected with the signal terminal of the termination circuit for processing the transmission signal input to the signal terminal;
   a control terminal configured to receive the control signal;
   a test terminal configured to receive a test signal; and
   a test signal generating circuit configured to generate the transmission signal for a test when receiving the test signal at an activated state at the test terminal, or to stop generating the transmission signal for the test when receiving the test signal at a non-activated state at the test terminal.

8. A test system comprising:
   the semiconductor device as claimed in claim 7; and
   a test device configured to supply the control signal to the semiconductor device for enabling the characteristic impedance matching function, and to supply the test signal to the semiconductor device for generating the transmission signal for the test to test the processing circuit.

* * * * *